United States Patent
Li

(10) Patent No.: US 8,271,841 B2
(45) Date of Patent: Sep. 18, 2012

(54) CIRCUITRY AND METHOD FOR AN AT-SPEED SCAN TEST

(75) Inventor: Zhen Song Li, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 198 days.

(21) Appl. No.: 11/762,353

(22) Filed: Jun. 13, 2007

(65) Prior Publication Data
US 2008/0004831 A1  Jan. 3, 2008

Related U.S. Application Data

(63) Continuation-in-part of application No. PCT/IB2004/004089, filed on Dec. 13, 2004.

(51) Int. Cl.
*G01R 31/30* (2006.01)
*G06F 11/00* (2006.01)

(52) U.S. Cl. .................. 714/745; 714/700; 714/726
(58) Field of Classification Search .................... 714/745
See application file for complete search history.

(56) References Cited

U.S. PATENT DOCUMENTS

| | | | |
|---|---|---|---|
| 5,349,587 A | 9/1994 | Nadeau-Dostie et al. | |
| 5,680,543 A | 10/1997 | Bhawmik | |
| 5,909,451 A | 6/1999 | Lach et al. | |
| 5,978,944 A * | 11/1999 | Parvathala et al. | 714/726 |
| 6,058,496 A * | 5/2000 | Gillis et al. | 714/727 |
| 6,065,145 A | 5/2000 | Bencivenga | |
| 6,070,260 A | 5/2000 | Buch et al. | |
| 6,195,776 B1 | 2/2001 | Ruiz et al. | |
| 6,286,119 B1 * | 9/2001 | Wu et al. | 714/726 |
| 6,323,715 B1 * | 11/2001 | Vatinel | 327/407 |
| 6,327,684 B1 | 12/2001 | Nadeau-Dostie et al. | |
| 6,442,722 B1 * | 8/2002 | Nadeau-Dostie et al. | 714/731 |
| 6,877,123 B2 * | 4/2005 | Johnston et al. | 714/731 |
| 7,007,213 B2 * | 2/2006 | Wang et al. | 714/729 |
| 7,013,417 B1 * | 3/2006 | Burlison et al. | 714/744 |
| 7,155,649 B2 * | 12/2006 | Nakao et al. | 714/726 |

(Continued)

FOREIGN PATENT DOCUMENTS

EP 1293791 3/2003

(Continued)

OTHER PUBLICATIONS

International Search Report and Written Opinion for PCT/IB2004/004089, dated Aug. 8, 2005, 11 pages.

*Primary Examiner* — Steve Nguyen
(74) *Attorney, Agent, or Firm* — Banner & Witcoff, Ltd.

(57) ABSTRACT

A method for testing an integrated circuit to detect delay faults resulting from a signal path from a first block of the integrated circuit to a second block of the integrated circuit, wherein first and second blocks are running at different application speeds. The method may include shifting first data into scan memory cells of the integrated circuit at a first frequency; applying a launch test clock pulse to the first block at a second frequency; applying a capture test clock pulse to the second block at the second frequency, wherein the first edges of the launch and capture pulses are delayed with respect to each other by a period that is a reciprocal of the second frequency; shifting second data from the scan memory cells to an output at the first frequency; and comparing the second data at the output with expected values.

19 Claims, 6 Drawing Sheets

U.S. PATENT DOCUMENTS

| | | | |
|---|---|---|---|
| 7,409,613 B2 * | 8/2008 | Rich et al. | 714/731 |
| 7,437,636 B2 * | 10/2008 | Rajski et al. | 714/726 |
| 7,685,542 B2 * | 3/2010 | Grise et al. | 716/4 |
| 2002/0120896 A1 | 8/2002 | Wang et al. | |
| 2003/0084390 A1 | 5/2003 | Tamarapalli et al. | |
| 2003/0101396 A1 | 5/2003 | Price | |
| 2003/0169070 A1 | 9/2003 | West et al. | |

FOREIGN PATENT DOCUMENTS

| | | |
|---|---|---|
| JP | 08201481 | 8/1996 |

* cited by examiner $m \in [1,N]$ $a,b \in [1,N]$ $a,b \in [1,N]$

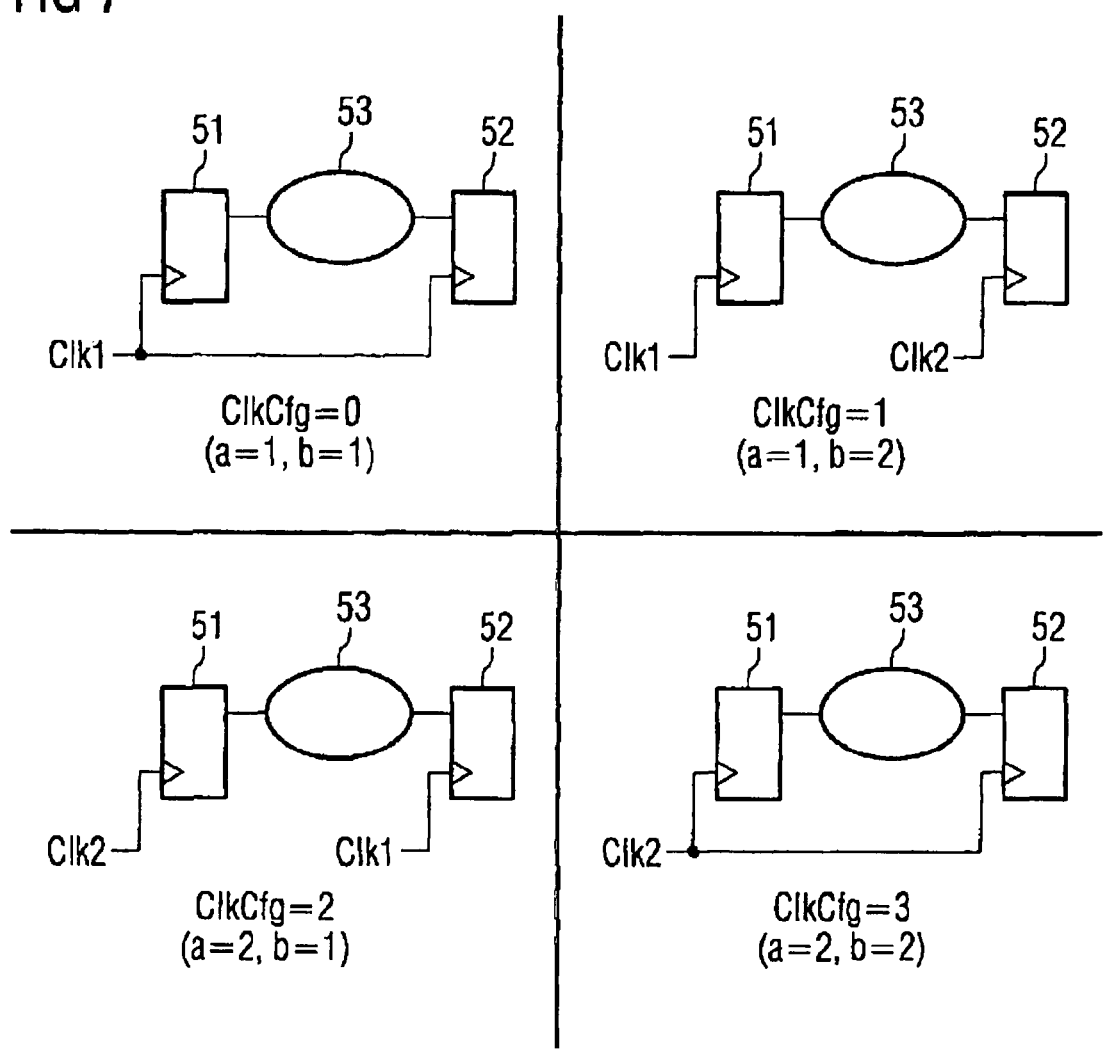

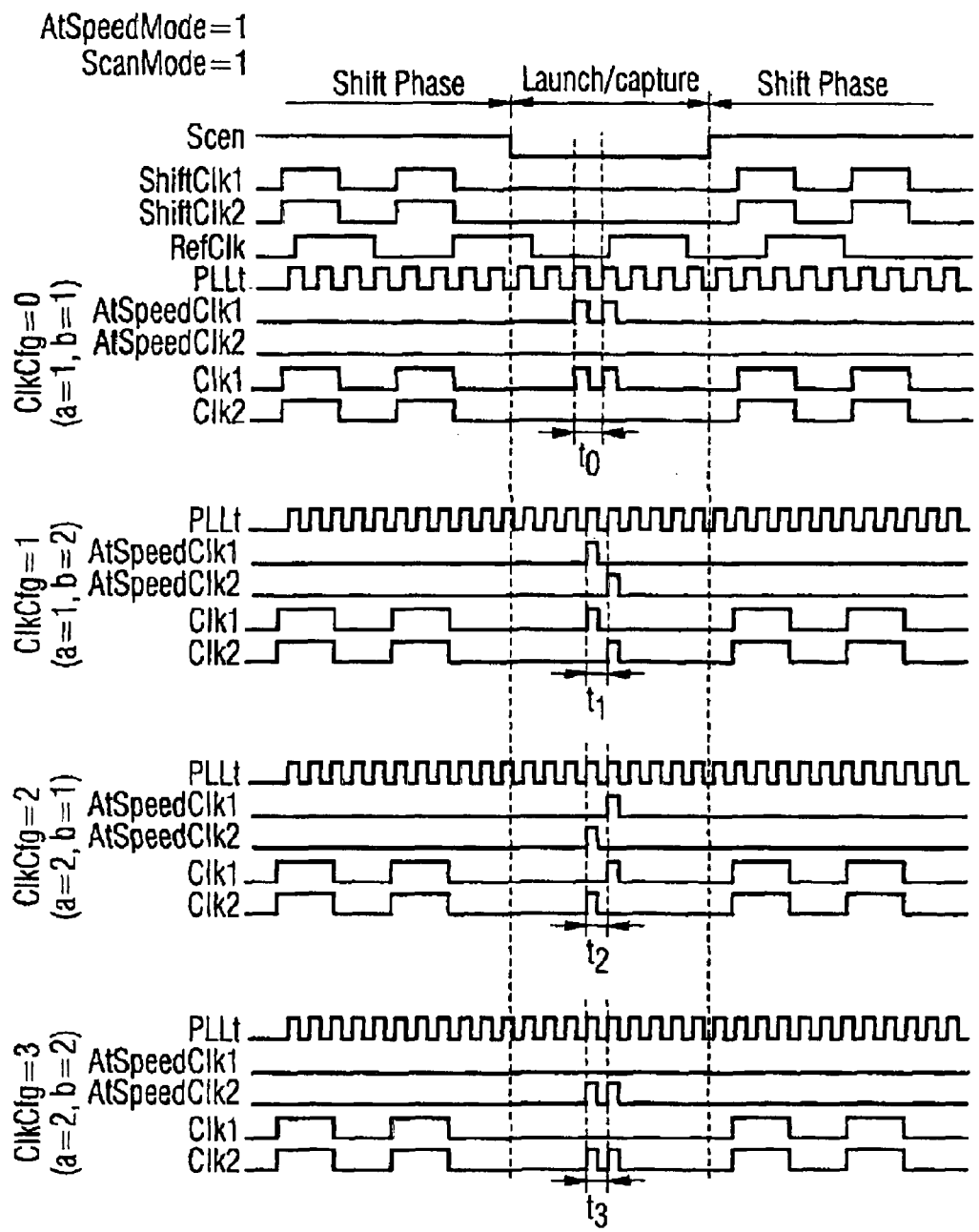

CIRCUITRY AND METHOD FOR AN AT-SPEED SCAN TEST

CROSS-REFERENCE TO RELATED APPLICATIONS

This application claims priority under 35 U.S.C. §120 and 35 U.S.C. §365(c) to, and is a continuation-in-part of, co-pending international PCT Application PCT/IB2004/004089, filed Dec. 13, 2004, entitled "Circuitry and Method for an At-Speed Scan Test," which is hereby incorporated by reference as to its entirety.

BACKGROUND

High-density integrated circuits typically need efficient testing that provides for high failure coverage and low testing costs. Several techniques to add circuitry to integrated circuits for supporting such testing are known as design for testability (DFT) techniques. Many of these DFT techniques are based on scan chain concepts. Scan chains contain memory cells that are connected as shift registers when a scan mode is applied. If no scan mode is applied, the memory cells are not connected as shift registers, and instead perform their application function. The shift registers form a chain from an input that is driven by a test controller to an output that may also be read by the test controller. The test controllers may be implemented externally as part of automated test equipment (ATE) or may be integrated in the integrated circuit that is under test.

In a scan test, data is shifted from the input to the memory cells to put them into a state under which the integrated circuit is to be tested. A test stimulus is applied to let the integrated circuit perform a defined operation to verify the functionality of the integrated circuit. The result of this operation is stored as data in the memory scan cells. After this operation, this data is shifted to the output of the integrated circuit to compare it with expected values.

Integrated circuits may have two or more clock domains, each domain containing circuitry and being driven by a different clock. The clocks differ in phases or frequencies. With DFT techniques, faults that result from signals crossing the border of two clock domains are difficult to detect.

U.S. patent application Pub. No. 2003/0084390 discloses a circuit to test integrated circuits with such different clock domains. The integrated circuit contains a phase-locked loop (PLL) that generates a clock with a frequency that differs from the frequency of external clocks. In the application, several of the clock domains are driven by the PLL.

During the scan test, the shifting of the data is performed by a relatively slow clock that is provided by ATE. The testing stimulus is applied within two sequences, a capture sequence and a launch sequence. In the launch sequence, one or more clock pulses are driven to a clock domain to start an event that changes a signal. In the capture sequence, clock pulses are driven to enable the circuits that receive the signal triggered in the launch sequence.

For the capture and launch clocks, fast pulses are provided to apply test conditions that are close to the application conditions. The capture and launch clocks are provided by the on-chip PLL and a Clock Controller. The clock pulses for the different domains can be either of the same frequency or of frequencies that are multiples of each other.

A problem is how to specify and to generate clock pulses for clock domains that run at different application speeds that are not multiples of each other.

SUMMARY

Various aspects as described herein are directed to, for instance, testing an integrated circuit to detect delay faults resulting from a signal path from a first block of the integrated circuit to a second block of the integrated circuit, wherein first and second blocks are running at different application speeds. The method may include, for example, shifting first data into scan memory cells of the integrated circuit at a first frequency; applying a launch test clock pulse to the first block at a second frequency; applying a capture test clock pulse to the second block at the second frequency, wherein the first edges of the launch and capture pulses are delayed with respect to each other by a period that is a reciprocal of the second frequency; shifting second data from the scan memory cells to an output at the first frequency; and comparing the second data at the output with expected values.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein:

FIG. 7 is a series of schematics showing four illustrative options for how two clocks may be applied to two latches for delay-fault tests, in accordance with various aspects as described herein.

FIG. 8 is a series of illustrative timing diagrams of delay-fault tests for the four options shown in FIG. 7.

DETAILED DESCRIPTION

Figure 1:
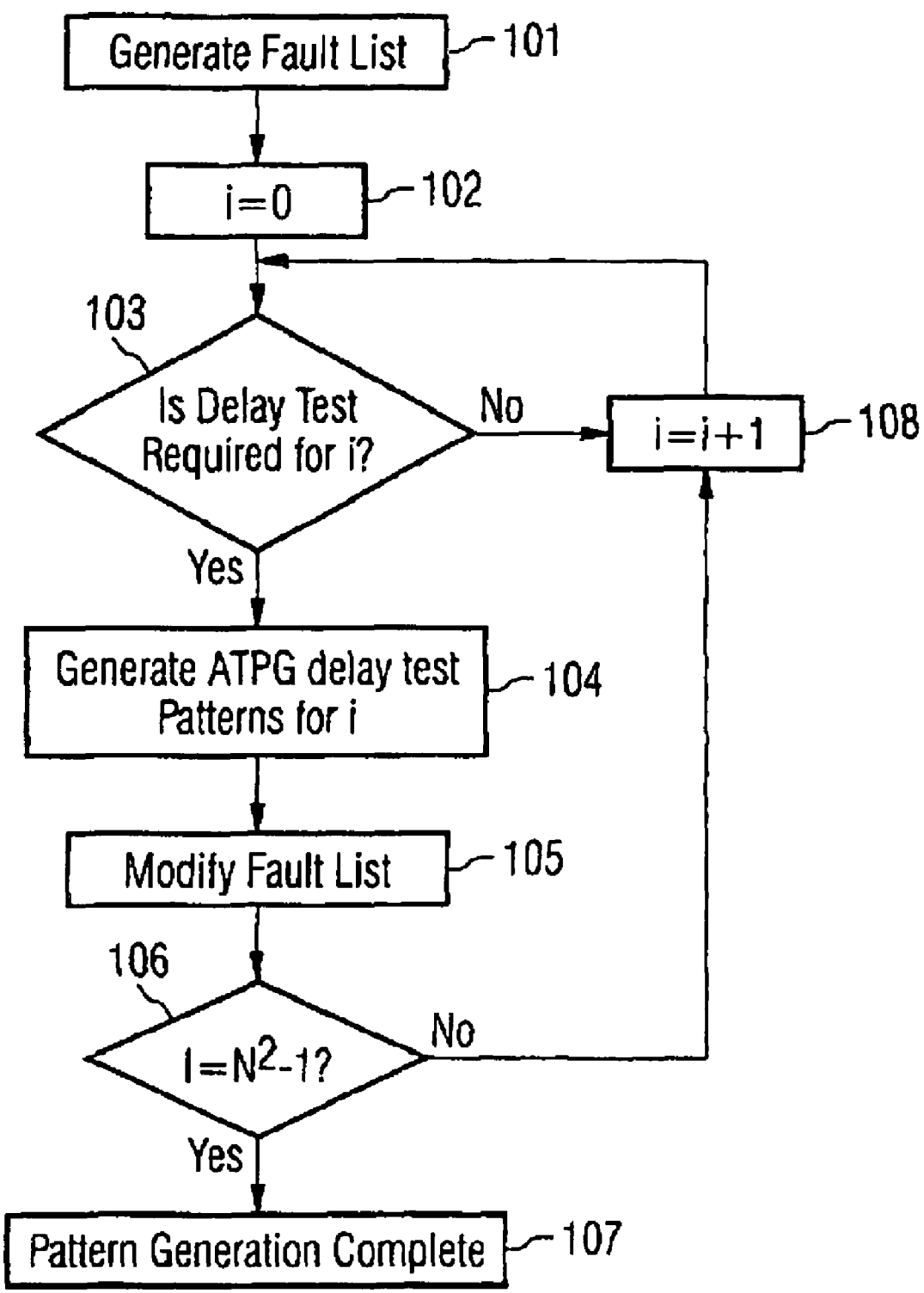
FIG. 1 is an illustrative flow chart of delay-fault testing of a system with N-clock domains in accordance with various aspects as described herein.

The various aspects described herein may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled" or "connected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

As will be described in further detail, various illustrative embodiments of circuitry may be provided that are configured to generate at-speed clocks suitable for use in launch and capture cycles. Additionally, various illustrative embodiments of methods may be provided for implementing structural delay testing an integrated circuit with multiple clock domains, to detect delay faults. These delay faults may result from a signal path from a first block of the integrated circuit to a second block of the integrated circuit. If a signal from a memory cell in the first block takes too long to be captured by a memory cell of the second block, the delayed signal may result in a malfunction, in this case a delay fault. The first and the second blocks may be distinguished by the respective different frequencies in which they are driven.

As an overview, an integrated circuit may have N clock domains running at different application frequencies. A clock scheme is provided that may allow for testing signal paths between two clock domains, even if the application frequencies are not multiples of each other. In addition, a method is provided for structural delay testing of an integrated circuit with multiple clock domains.

In particular, scan memory cells may be placed into a scan test mode, and data may then be shifted into the scan memory cells at a reference frequency. A launch test clock pulse may be applied to the first block at a launch test frequency. The launch test clock pulse may drive the memory cells of the first block and start signals that are driven by this first block. In addition, a capture test clock pulse may applied to the second block at a capture test frequency. The memory cells in the second block may be activated by the capture test clock pulse, and they may store the signals that are driven to the inputs of those memory cells. The signal that was driven from the first block may now be stored. If the propagation of the signal is too long, storage may take place before the signal arrives. In this case, a delay fault has occurred and may be detected.

Data then may be shifted from the scan memory cells to an output at the reference frequency. The output may be, for instance, a physical conductive pin of the integrated circuit package, and may be electronically read by automatic test equipment (ATE).

Then, the read values at the outputs may be compared with expected values, since the read values at the output represent the data that was captured by the capture pulse in the second block. Although the application speeds of the first and second blocks may be different, the launch and the capture test frequencies may be allowed to be the same. The first edge of both the launch test clock pulse and the capture test clock pulse may be delayed with respect to each other by a period that is approximately or exactly the reciprocal of the launch test frequency. The launch test frequency may be specified according to the application speed requirement of a signal that runs through a signal path from the first block to the second block. This scheme potentially may allow for easier circuitry design, because the launch and the capture test clock pulses may be derived from the same clock. The delay between the launch and the capture pulses may be reciprocally proportional to the launch test frequency. Blocks running at different frequencies thus potentially may be easily tested without the need for programming the phase differences between the launch and the capture cycles.

A potential advantage of this clock scheme is that the timing difference between launching and capturing clocks may be specified in accordance with the functional application speed and both clocks may be pulsed at a common frequency. This may potentially allow the design of the at-speed clock generation circuitry to be simplified.

The launch test frequency may, for example, be approximately or exactly the reciprocal of the time that a signal needs to propagate from a latch in the first block to a latch in the second block without causing a delay fault.

If the launch capture frequency is, for example, 5 to 20% larger than the reciprocal of the time that a signal is allowed to propagate from a latch in the first block to a latch in the second block, the integrated circuit may be tested with a margin to determine whether the integrated circuit still works under various conditions like over- or under voltage, temperature shifts and/or process variations.

If the reference frequency is slower than the launch and the capture frequency and is provided by an ATE, the path between the shift registers between memory cells may not be time critical, and thus clock tree synthesis (CTS) may be simplified, or at least not further complicated. This scheme may further utilize a low frequency ATE for at-speed testing, which may reduce or even eliminate the dependency on high-end ATE's and hence may reduce overall testing costs.

If the application frequencies of clock a and of clock b are not multiples of each other, for example, the above method may easily be applied because the test frequencies may simply depend on the application speed requirements of signals between the first and the second block. It may not be necessary to program and control the phase differences between the launch and the capture pulses, because the phase differences of the pulses may result from the launch and capture test frequency.

In another illustrative embodiment, a method may be provided for generating test patters to test integrated circuits that have N>1 blocks being distinguished by the N different frequencies. The method may include generating an empty fault list that includes N×N elements. A counting variable i may be set to a predetermined value, such as zero, and it is determined whether a delay test is desired or otherwise appropriate for element i, which corresponds to a launch cycle in block j and a capture cycle in block k. The value j may be calculated by dividing i by N and rounding the result of this division down to the next integer. The value k may be calculated by subtracting j times N from i. If a delay test is desired or otherwise appropriate, a test pattern may be generated for a launch test pulse for block j and a capture test pulse for block k. The testing pattern may be, for instance, a list of commands that an ATE may executed to test an integrated circuit.

The test pattern may be generated by an automated test pattern generator (ATPG), which is a computer program that helps to generate the list of commands.

The generated test pattern may be stored in the fault list as element i. Then, it may be checked whether i is equal to $N^2-1$. If so, the variable i may be incremented, such as by one.

This method may provide for structural testing of all possible signal paths between the clock domains, thereby potentially generating test patterns only for those clock domains in which delay faults can occur. The generated test pattern may be, for example, a test pattern that carries out a method for testing integrated circuits to detect delay faults.

The decision of whether to conduct a delay test for the blocks j and k may be based on the usage of design information. During the initial design of the integrated circuit, the design information, if there is a signal path between block k and block j, may be available. If there is a signal path, a delay test may be conducted. The frequencies that are used for the launch test pulse and the capture test pulse may also determined by use of this design information. The length of the signal paths and the timing conditions may be specified during the initial design of the integrated circuit. This information may be used to specify the frequency of the launch test pulse without the need for running a characterization test to define the frequencies and the delay.

Moreover, an integrated circuit may be provided that includes a plurality of N>1 clock domains, each operating at a different application speed. Each clock domain may contain a plurality of memory cells. The integrated circuit may further include at least one phase-locked loop (PLL) or other frequency-generating circuitry that is on-chip, and may further include a plurality of application clock drivers. The application clock drivers may be PLLs, clock dividers, delay circuits and/or buffers.

An at-speed-clock generator may be provided that has a clock input coupled to an on-chip PLL. Control inputs and N outputs may be applied to the at-speed clock generator. The at-speed clock generator may either maintain all outputs stable or drives clock pulses at two of the N outputs. The phase and frequency of the two pulses may be the same as the phase and the frequency of the clock input of the at-speed clock generator. Driving the at-speed clocks of the PLL may allow the launch and capture frequencies to exceed the limits of automated test equipment.

The integrated circuit may further include at least one scan path through the clock domains. Memory cells of the clock domains may be used as the shift registers of the scan path.

In the integrated circuit, a plurality of N clock multiplexers may be provided, and each of these clock multiplexers may drive one clock domain. Each clock multiplexer may select either an output of the at-speed clock generator, an application clock, or a shift clock. Each of the N outputs of the at-speed clock generator may be coupled to a different clock multiplexer and each of the N-application clocks may be coupled to a different clock multiplexer.

The integrated circuit may simply utilize a limited number of logic circuit elements, such as transistors, to provide the delay fault testing. This may allow the costs of designing and/or producing the integrated circuit to be reduced. This may further allow for reduction in the complexity of test programming, because it may allow for only one frequency for the launch and the capture pulses to be programmed. If the clock pulses at the two outputs of the at-speed-clock generator are driven in subsequent clock cycles, the first output may be used to drive a launch test cycle, and the second output may be used to drive a capture test cycle.

Further, if a signal indicates that the integrated circuit is in a scan test mode, this signal may be used to trigger the clock multiplexers to select the shift clocks and the memory cells to be connected as shift registers. This may mean that the memory cells can be programmed by the shift registers to a specific state in which the integrated circuit has to be tested.

Various illustrative aspects and embodiments of the invention will now be described with reference to the figures. Referring to FIG. 1, a flow chart is shown in connection with delay-fault testing of a system with N-clock domains in accordance with an illustrative embodiment. In this embodiment, an integrated circuit has N blocks, each running at a different clock. The clocks differ in frequencies and/or phases. The different frequencies may or may not be multiples of each other. For an integrated circuit with N-clock domains, faults may be classified into $N^2$ groups according to the possible number of combinations of launch and capture clocks, which may or may not be asserted at speed. For example, a delay test may not desired for faults located between clock domains that are asynchronous to each other. There are overall $N^2$ clock configurations based on the number of different fault groups.

In accordance with the illustrative embodiment, to generate a complete set of test patterns, a fault list is initialized in a first step 101, wherein the fault list has $N^2$ elements. Each of the elements contains either a test pattern or an indication of no test pattern. After initialization, all elements have a value that indicates no test pattern.

The elements of this fault list differ in the blocks to which the launch and capture clocks are applied. For example, the first element may contain a test pattern for the first block driven by a launch and the second block driven by a capture clock. The second element may contain the test pattern for a first block being tested with the launch and the second block being tested with the capture clock.

In step 102, a counting variable i is initialized and set to a known value such as zero. A decision (step 103) is made if a delay test is desired for the element with the actual number i. The number of the clock domain for the launch cycle is calculated by dividing i by N and rounding the result of this operation down to the next integer. The clock domain number for the capture cycle is calculated by subtracting the number of a launch domain times seven from i. If, for example, the counting variable i is 0 and the number of domains N is 7, the launch and the clock domains are 0. If, in a modification, i is 10, the number of the launch domain is 1 and the number of the capture domain is 3.

If no delay test is desired, the method continues with an increment step 108, in which counting variable i is incremented by one. After the increment step 108, the process continues with the decision 103. If a delay test is required, an automatic test pattern generation (ATPG) delay test pattern is generated for the launch and capture domains that were calculated during the decision step 103. Then, the fault list is modified (step 105) by writing the delay test pattern in the fault list as element i.

In the following step 106, it is checked whether i equals $N^2-1$. If so, then the pattern generation is complete. If not, then the process continuous with increment step 108.

Figure 2:
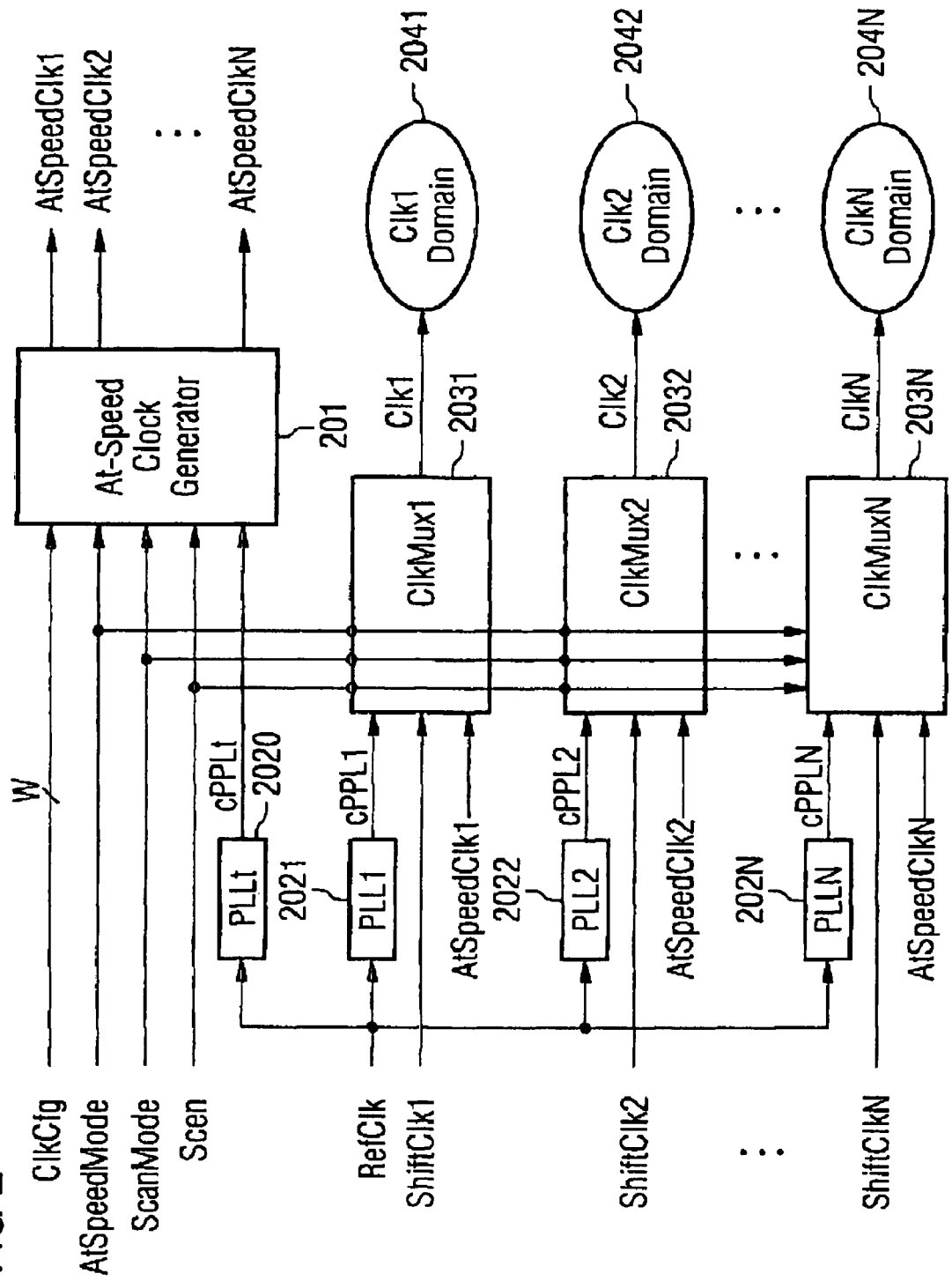
FIG. 2 is an illustrative schematic of a circuit that generates and select clocks for delay-fault testing in accordance with various aspects as described herein.

FIG. 2 shows a schematic block diagram of an illustrative embodiment of a circuit that generates and select clocks for delay-fault testing. The block diagram shows an at-speed clock generator 201, PLL's 2020 to 202N, clock multiplexers 2031 to 203N and clock domains 2041 to 204N. These various blocks are driven by a reference clock RefClk, shift clocks ShiftClk1 to ShiftClkN and at-speed clocks AtSpeedClk1 to AtSpeedClkN. Reference clock RefClk is input to PLL's 2020 to 202N to generate PLL clocks cPLLt to cPLLN. At-speed clock generator 201 generates clock AtSpeedClk1 to AtSpeedClkN from PLL clock cPLLt, depending on its control inputs ClkCfg, AtSpeedMode, ScanMode and Scen. Control input ClkCfg may be a bus with a bus width W. W may be equal to the value obtained by rounding up $2 \log_2(N)$ to the next integer. For example, where N is 7, the bus width W of ClkCfg would be 6.

Each of the clock multiplexers 2031 to 203N selects one of three clocks to run one of the clock domains 2041 to 204N. Each clock multiplexer ClkMuxi receives clocks cPLLi, ShiftClki, AtSpeedClki as inputs and outputs clock Clki to its appropriate clock domain 2041. Which clock is selected depends on control signals AtSpeedMode, ScanMode and Scen.

During operation, the clock that is generated by one of the PLL's 2020 to 202N runs the clock domains 2041 to 204N at application speed.

To shift the data into the scan chain, low frequency clocks ShiftClk1 to ShiftClkN run the clock domains 2041 to 204N at relatively low speed that is within the range of the ATE.

For the application of the launch and capture phases, two of the clock domains 2041 to 204N are driven by fast clocks AtSpeedClk1 to AtSpeedClkN at a speed that is close to the application speed. Except for the launch and the capture domains, various domains may not be driven by clock during the launch and capture phase.

Figure 3:
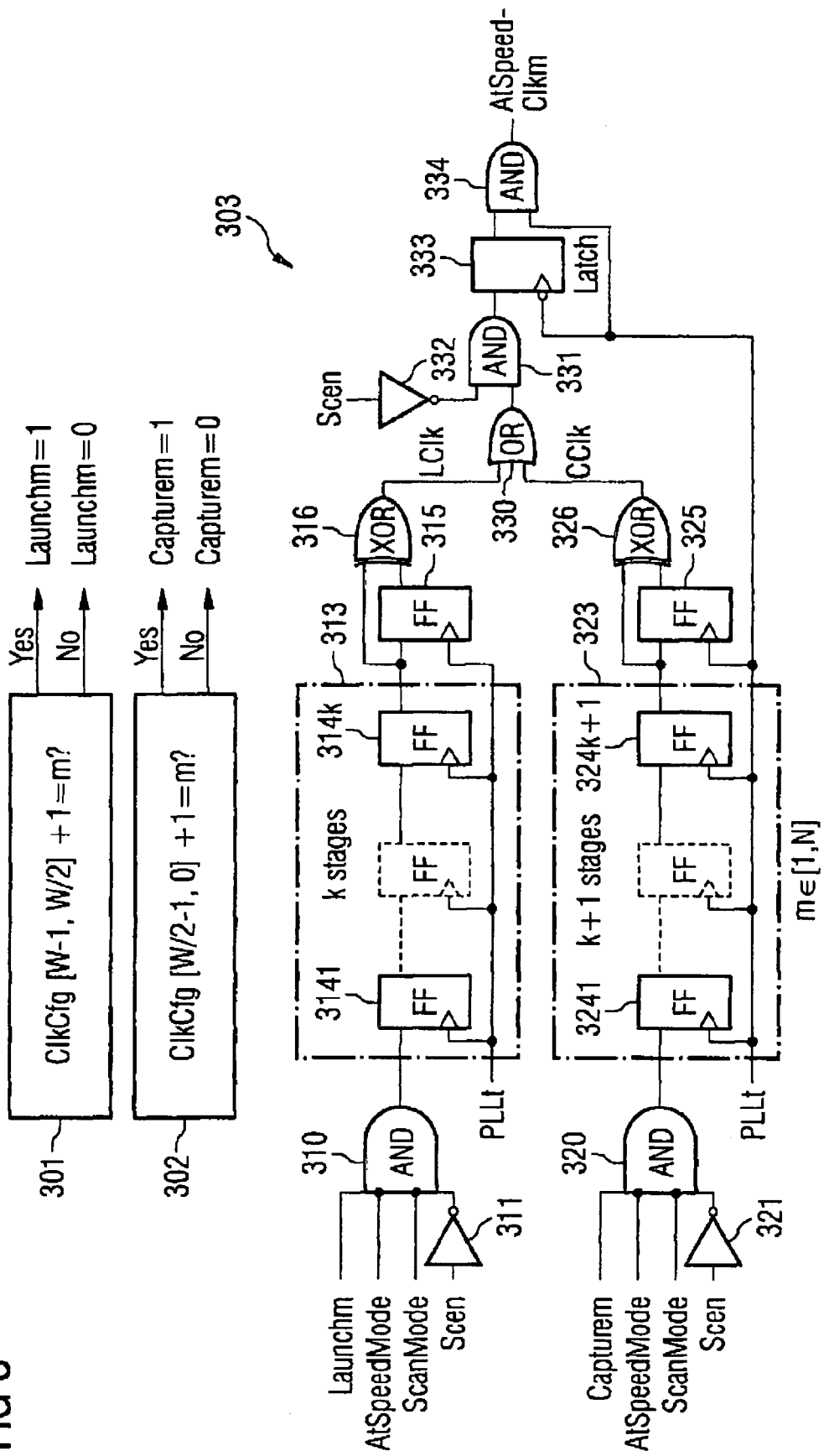
FIG. 3 is an illustrative schematic showing details of the clock generation block of FIG. 2.

FIG. 3 shows illustrative details of the At-Speed Clock Generator 201 of FIG. 2. A According to the embodiment of FIG. 3, at-speed clock generator 201 has N instances of blocks that contain of a pair of ClkCfg decoders 301 and 302 and a pulse generators 303. Index m represents the instance in FIG. 3 and is a number between one and N.

The first ClkCfg decoder 301 detects whether the upper half of the bus ClkCfg has a value that is equal to the number m minus one. If so, then signal Launchm is set to 1, otherwise it is set to 0. The second ClkCfg decoder 302 sets the signal Capturem to 1 if the lower half of ClkCfg bus is equal to the number of the instance m minus one, otherwise the signal Capturem stays at 0. In some embodiments, only one instance of the N instances within the at-speed clock generator 301 may have its signal Capturem at 1. It may be the same or different instances, for which Launchm and Capturem are one. The upper half of the bus for ClkCfg may range from element number W−1 to element number W/2, and the lower half of ClkCfg may range between the element numbers W/2−1 to 0.

In an illustrative embodiment of the design with two clock domains, N=2, ClkCfg=0 is associated with the fault launch and captured by Clk1; ClkCfg=1 is associated with the fault Clk1 and captured by Clk2; ClkCfg=2 is associated with the faults launch by Clk2 and captured by Clk1; and ClkCfg=3 is associated with the faults launched and captured by the Clk 2.

In some embodiments, the at-speed clock generator may be designed such that there is only one clock signal that is pulsed once in a launch cycle, with other clocks inactive; the same may also apply to the capture cycle.

In the shown embodiment, the pulse generator 303 generates a pulse at the output signal AtSpeedClkm depending on inputs ScenLaunchm, Capturem, AtSpeedMode, ScanMode and PLLt. Pulse generator 303 has four AND gates 310, 320, 331 and 334, three inverters 311, 321 and 332, two flip-flop rows 313 and 323, three single flip-flops 315, 325 and 333, two XOR gates 316 and 326 and an OR gate 330.

The first three inputs of AND gate 310 are connected to the signals Launchm, AtSpeedMode and ScanMode. The fourth input of the AND gate 310 is connected to Scen through the inverter 311. The output of AND gate 310 is coupled to the first flip-flop of flip-flop row 313. Flip-flop row 313 has k stages of flip-flops. The clock inputs of all k flip-flops are connected to the clock PLLt. The flip-flops 3141 to 304k are connected in a row such that the data output of a flip-flop 1 is connected to the data input of the next flip-flop 1+1. The input of the first flip-flop 3141 is connected to the output of AND gate 310, and the output of the last flip-flop 314k is connected to the data of flip-flop 315 and to the first input of XOR gate 316. The clock input of flip-flop 315 is connected to clock PLLt, and the clock output is connected to the second input of XOR gate 316. The output of XOR gate 316 is coupled to node LClk.

The first three inputs of AND gate 320 are connected to signals Capturem, AtSpeedMode and ScanMode. The fourth input of the AND gate 320 is connected with a signal Scen thru the inverter 321. The output of the AND gate 320 is connected to the data input of the first flip-flop 3241 of the flip-flop row 323. The flip-flop row has k+1 flip-flops 3241 to 324k+1. The clock inputs of these flip-flops 3241 to 324k+1 are connected to clock PLLt, and the clock outputs are connected to the data input of the appropriate next flip-flop. The output of the last flip-flop 324k+1 is connected to the data input of flip-flop 325 and the first input of XOR gate 326. The clock input of flip-flop 325 is connected to clock PLLt and the output is connected to the second input of the XOR 326. The output of XOR gate 326 is connected to node CClk.

The input of OR gate 330 is connected to signals LClk and CClk, and the output of OR gate 330 is connected to the first input of AND gate 331. A second input of AND gate is connected to the output of inverter 332. The input of inverter 332 is connected to signal Scen. The output of AND gate 331 is connected to the data input of data latch 333. The inverting clock input of latch 333 is connected to clock signal PLLt, and the output of latch 333 is connected to the first input of AND gate 334. The second input of AND gate 334 is connected to clock signal PLLt. The output of AND gate 334 is coupled to output signal AtSpeedClkm.

If ScanMode is off, signal Scen is low and signal Launchm is applied high, then all of the four inputs of AND gate 310 may be high. This may be done so as to apply a capture pulse cycle by the instance with the number m. In this case, the output of the AND gate 310 becomes high resulting in a clock pulse at node LClk after k+0.5 cycles. Similarly, a clock pulse is generated at node CClk if ScanMode is off and instances signal Capturem switches to high. A pulse at node LClk or CClk is output at node AtSpeedClkm synchronized with clock PLLt.

Figure 4:
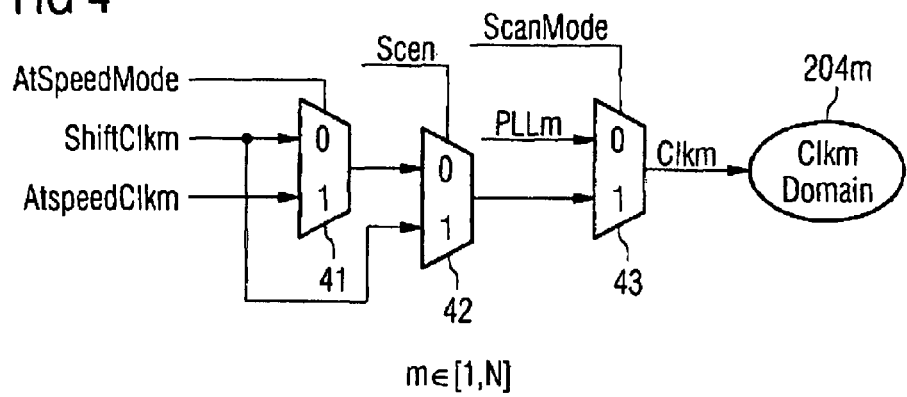
FIG. 4 is an illustrative schematic showing a clock selection scheme associated with the circuit of FIG. 2.

FIG. 4 shows details of an illustrative embodiment of one of clock multiplexers 2031 to 203N running one of clock domains 241 to 204N of FIG. 2. A clock multiplexer in this embodiment has a first multiplexer 41, a second multiplexer 42 and a third multiplexer 43 running a clock domain 204m. The first and second data inputs of multiplexer 41 are coupled to the nodes ShiftClkm and AtSpeedClkm, respectively. The control input of multiplexer 41 is connected to node AtSpeedMode. The first input of multiplexer 42 is connected to the output of first multiplexer 41, the second data input of multiplexer 42 is connected to the node ShiftClkm and the control input of multiplexer 42 is connected to the node Scen. The first input of third multiplexer 43 is connected to the node PLLm, the second input of multiplexer 43 is connected to the output of second multiplexer 42 and the control input of multiplexer 43 is connected to node ScanMode. The output of third multiplexer 43 is connected to node Clkm that runs clock domain 204m. Table 1 is an overview of the above described functions of the clock multiplexer in the present embodiment.

TABLE 1

| ScanMode | Scen | AtSpeedMode | Clkm |
| --- | --- | --- | --- |
| 0 | x | X | PLLm |
| 1 | 1 | X | ShiftClkm |
| 1 | 0 | 0 | ShiftClkm |
| 1 | 0 | 1 | AtSpeedClkm |

Figure 5:
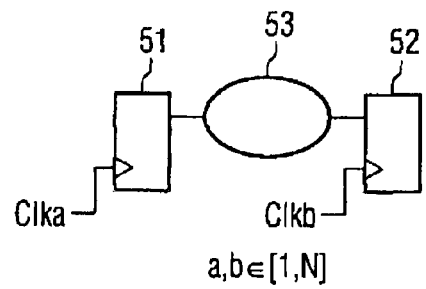
FIG. 5 is an illustrative schematic showing two latches at which a delay-fault testing is applied, in accordance with various aspects as described herein.

FIG. 5 shows an example how two clocks Clka and Clkb may be applied to two clock domains. Elements a and b in FIG. 5 are elements of the natural numbers between 1 and N and may have different values for this example. A flip-flop 51 belongs to clock domain a and a flip-flop 52 belongs to clock domain b. The clock input of flip-flop 51 is driven by the clock signal Clka while the clock input of flip-flop 52 is driven by the clock Clkb. There are logic blocks 53 between first flip-flop 51 and second flip-flop 52.

In a delay-fault test, it may be verified whether the delay between the output of first flip-flop 51 and the input of second flip-flop 52 is not too large. If the delay is too large, this may result in a delay-fault. The test may be performed by first shifting data into the flip-flops of the chip, then applying a launch pulse at clock Clka and after a certain delay a capture pulse at clock Clkb. The output of second flip-flop 52 may be shifted to the output of the integrated circuit and than compared to an expected value.

Figure 6:
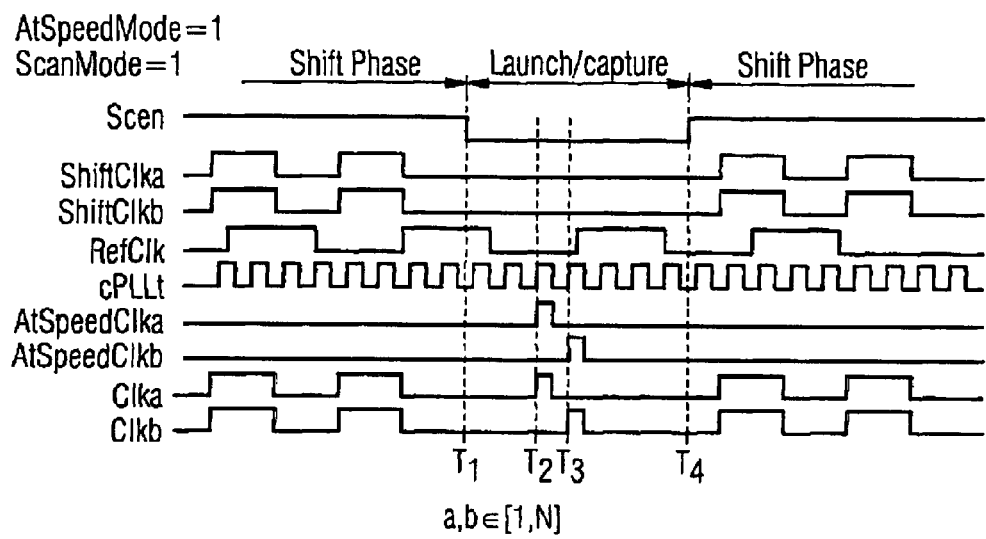
FIG. 6 is an illustrative timing diagram of a delay-fault test, in accordance with various aspects as described herein.

FIG. 6 is a timing diagram showing shift cycles, launch and capture cycles from the Clka domain to the Clkb domain in an illustrative embodiment of a system with N clock domains. The timing of FIG. 6 is divided into a first shift phase until $T_1$, a launch-capture phase until $T_4$ and a second shift phase. During all the phases the signals AtSpeedMode and ScanMode are high to enable the delay-fault testing. The reference clock RefClk is driven by the external ATE. From this reference clock RefClk a PLL clock cPLLt is derived with a higher frequency. During the first shift phase the signal Scen is high enabling the clocks Clka and Clkb to run at the frequency of the shift clocks ShiftClka and ShiftClkb. The shift clocks ShiftClka and ShiftClkb may also be derived from the ATE.

At $T_1$, the launch-capture cycle begins with Scen going low. After Scen goes low, Clka is pulsed once with the same frequency of PLLt after (k+1) cycles. Index k is an integer that depends on the number of synchronization stages that are required for the stabilization of Scen, which is a high fan-out signal and which may utilize a longer delay than the PLL to stabilize. Clkb is pulsed in a similar manner after (k+2) PLLt cycles, which is may be one PLLt clock later than the pulse of Clka.

When Scen goes low, subsequent pulses are generated at clocks AtSpeedClka and AtSpeedClkb beginning at $T_2$ and $T_3$, respectively. These two pulses drive the launch pulse at node Clka and the capture pulse at node Clkb. At $T_4$, signal Scen goes high again to start the second shift phase to shift the data that was received at a flip-flop in the Clkb domain to the output. At the output, the data that was received at the capture cycle is compared to expected values.

FIG. 7 shows the four illustrative options of how two clocks may be applied to two flip-flops in different clock domains to test delay-faults. For each option, there is a first flip-flop 51, a second flip-flop 52 and a logic block 53 between the output of first flip-flop 51 and the input of second flip-flop 52. If the number of clock domains N is equal to zero, then the bus ClkCfg may carry one of the values 0, 1, 2 or 3. In the upper left quadrant of FIG. 7, ClkCfg is zero, a and b are both equal to one, and the launch and capture pulses are both driven by the same clock Clk1 connected to the clock inputs of first flip-flop 51 and second flip-flop 52. In the upper right quadrant of FIG. 7, the launch clock is applied to clock Clk1 at the clock input of first flip-flop 51, whereas the capture pulse is driven by clock Clk2 to second flip-flop 52. In the lower left quadrant of FIG. 7, the launch pulse at the first flip-flop 51 is driven by Clk2 and the capture clock at the second input 52 is driven by the clock Clk1. In the lower right quadrant of FIG. 7, both the launch and the capture clocks are driven by Clk2.

FIG. 8 shows illustrative timing diagrams of delay-fault tests for the four options shown in FIG. 7.

The timing diagrams of FIG. 8 are each divided into three phases, a first shift phase, a launch-capture phase and a second shift phase. The first and second shift phases are the same as the shift phase in FIG. 6 and thus will not be explained here in detail again.

For the first option, bus ClkCfg is zero, and so the launch and capture clocks are driven by the same clock Clk1. In this case, the clock and the launch pulses are driven to flip-flops both being in the same clock domain Clk1. The time period between the launch and capture pulses is to, which is the clock period of the PLL (which runs in range of the application frequency of the clock domain 1).

For ClkCfg=1, the launch pulse is driven in the first clock domain with clock Clk1 and the capture pulse is driven in the second clock domain with clock Clk2. The delay between the launch and capture pulses is $t_1$, which corresponds to the frequency of the PLL.

The frequency of the PLL is higher than the frequency in the case of ClkCfg=0. In the first case of ClkCfg=0, the delay between a capture and the launch event naturally equals the period of the PLL clock that is in the range of the application frequency. At ClkCfg=1, the frequency of PLLt is specified according to the functional speed requirement from Clk2 to Clk1. This frequency may differ from both of the application frequencies of Clk2 and Clk1.

In the second case, with ClkCfg=1, the frequency of the PLL may correspond to the delay to be tested between the launch and capture flip-flops. Therefore, the PLL may run at a completely different frequency than the application frequencies of clock domain 1 and clock domain 2.

For ClkCfg=2, the launch clock is driven by Clk2, and the capture clock is driven by Clk1. In the fourth case with ClkCfg=3 (lower right quadrant of FIG. 7), both the launch and capture pulses are driven by clock Clk2 with a frequency that is in the range of the application frequency of clock domain 2.

The various method steps described herein may be performed by testing equipment, which may include, for instance, a programmable computer. The computer may execute computer-executable instructions stored on a computer-readable medium in order to perform the previously-described steps. The computer-readable medium may include, for instance, one or more magnetic media such as a magnetic disk, one or more optical media such as a compact disk (CD ROM), one or more memory chips, and the like.

Thus, various aspects as described herein may potentially enable delay testing within clock domains and with crossing clock domains in an integrated circuit with multiple system clocks. Shifting cycles may be pulsed for all clock domains at a common low frequency that may be within the range of the ATE. As a potential additional benefit, this approach does not necessarily complicate any clock tree synthesis (CTS).

The invention claimed is:

1. A method for testing an integrated circuit to detect delay faults resulting from a signal path from a first block of the integrated circuit to a second block of the integrated circuit, the method comprising:
   shifting first data into scan memory cells of the integrated circuit at a first frequency;
   determining a second frequency according to a speed of the signal path from the first block to the second block;
   applying a launch test clock pulse to a clock input of the first block;
   applying a capture test clock pulse to a clock input of the second block, wherein the first edges of the launch and capture pulses are delayed with respect to each other by a period that is a reciprocal of the second frequency, wherein the first and second blocks run at different application speeds;
   shifting second data from the scan memory cells to an output at the first frequency; and
   comparing the second data at the output with expected values,
   wherein determining the second frequency comprises determining the second frequency to be in a range of 5-20% larger than the reciprocal of a time that a signal propagates from a latch in the first block to a latch in the second block.

2. The method of claim 1, further comprising determining the second frequency to be a reciprocal of a time that a signal propagates from a latch in the first block to a latch in the second block without causing a delay fault.

3. The method of claim 1, further comprising:
   determining the first frequency so as to be lower than the second frequency; and
   generating a clock signal of the first frequency from an automatic test equipment (ATE).

4. The method of claim 1, wherein the application speeds of the first block and the second block are not multiples of each other.

5. The method of claim 1, wherein applying the launch test clock pulse comprises applying the launch test clock pulse to the clock input of the first block but not to the clock input of the second block, and applying the capture test clock pulse comprises applying the capture test clock pulse to the clock input of the second block but not to the clock input of the first block.

6. The method of claim 1, wherein the launch test clock pulse and the capture test clock pulse together define a pair of pulses occurring at the second frequency.

7. The method of claim 1, further comprising generating a reference signal comprising a series of pulses occurring at the second frequency, wherein applying the launch test clock pulse comprises applying the launch test clock pulse such that a first edge of the launch test clock pulse is generated responsive to a first one of the pulses of the reference signal.

8. The method of claim 7, wherein applying the capture test clock pulse comprises applying the capture test clock pulse such that a first edge of the capture test clock pulse is generated responsive to a second one of the pulses of the reference signal.

9. The method of claim 8, wherein the second one of the pulses of the reference signal is an immediate next pulse in the series of pulses after the first one of the pulses of the reference signal.

10. The method of claim 1, wherein the launch test clock pulse and the capture test clock pulse do not overlap with each other.

11. A method, comprising:
   shifting first data into a plurality of scan memory cells of an integrated circuit at a first frequency;
   applying a launch test clock pulse to a clock input of a first block of the integrated circuit;
   applying a capture test clock pulse to a clock input of a second block of the integrated circuit, wherein the first edges of the launch and capture pulses are delayed with respect to each other by a period that is a reciprocal of a second frequency, wherein the first and second blocks run at different application speeds, and wherein the second frequency is based upon an application speed requirement of a signal that runs through a signal path from the first block to a second block;
   shifting second data from the scan memory cells to an output at the first frequency; and
   determining the second frequency to be in a range of 5-20% larger than the reciprocal of a time that the signal propagates from a latch in the first block to a latch in the second block.

12. The method of claim 11, further comprising determining the second frequency to be a reciprocal of a time that a signal propagates from a latch in the first block to a latch in the second block without causing a delay fault.

13. The method of claim 11, further comprising:
   determining the first frequency so as to be lower than the second frequency; and
   generating a clock signal of the first frequency from an automatic test equipment (ATE).

14. The method of claim 11, wherein the application speeds of the first block and the second block are not multiples of each other.

15. The method of claim 11, wherein applying the launch test clock pulse comprises applying the launch test clock pulse to the clock input of the first block but not to the clock input of the second block, and applying the capture test clock pulse comprises applying the capture test clock pulse to the clock input of the second block but not to the clock input of the first block.

16. A method for testing an integrated circuit to detect delay faults resulting from a signal path from a first block of the integrated circuit to a second block of the integrated circuit, the method comprising:
   shifting first data into scan memory cells of the integrated circuit at a first frequency;
   applying a launch test clock pulse to a clock input of the first block;
   applying a capture test clock pulse to a clock input of the second block, wherein the first edges of the launch and capture pulses are delayed with respect to each other by a period that is a reciprocal of a second frequency, wherein the first and second blocks run at different application speeds, and wherein the second frequency is based upon an application speed requirement of a signal that runs through the signal path from the first block to the second block;
   shifting second data from the scan memory cells to an output at the first frequency;
   comparing the second data at the output with expected values; and
   determining the second frequency to be in a range of 5-20% larger than the reciprocal of a time that the signal propagates from a latch in the first block to a latch in the second block.

17. The method of claim 16, further comprising determining the second frequency to be a reciprocal of a time that a signal propagates from a latch in the first block to a latch in the second block without causing a delay fault.

18. The method of claim 16, further comprising:
   determining the first frequency so as to be lower than the second frequency; and
   generating a clock signal of the first frequency from an automatic test equipment (ATE).

19. The method of claim 16, wherein the application speeds of the first block and the second block are not multiples of each other.

* * * * *